(12) United States Patent
Kodama (10) Patent No.: US 9,883,581 B2
(45) Date of Patent: Jan. 30, 2018

(54) MULTI-CORE DIFFERENTIAL SIGNAL CABLE INCLUDING A GAP FOR A MOVABLE INSULATION

(71) Applicant: Hitachi Metals, Ltd., Tokyo (JP)

(72) Inventor: Sohei Kodama, Hitachi (JP)

(73) Assignee: HITACHI METALS, LTD., Tokyo (JP)

( * ) Notice: Subject to any disclaimer, the term of this patent is extended or adjusted under 35 U.S.C. 154(b) by 88 days.

(21) Appl. No.: 14/874,413

(22) Filed: Oct. 3, 2015

(65) Prior Publication Data
US 2016/0111187 A1 Apr. 21, 2016

(30) Foreign Application Priority Data
Oct. 21, 2014 (JP) .................. 2014-214390

(51) Int. Cl.
| | |
|---|---|
| H05K 1/02 | (2006.01) |
| H01B 11/18 | (2006.01) |
| H01P 3/02 | (2006.01) |
| H01B 11/00 | (2006.01) |
| H01B 13/08 | (2006.01) |
| H01B 11/20 | (2006.01) |

(52) U.S. Cl.
CPC ....... *H05K 1/0245* (2013.01); *H01B 11/1869* (2013.01); *H01P 3/02* (2013.01); *H01B 11/002* (2013.01); *H01B 11/1826* (2013.01); *H01B 11/20* (2013.01); *H01B 13/0841* (2013.01)

(58) Field of Classification Search
CPC ................................. H01P 3/04; H05K 1/0245
USPC .............................................. 333/4, 5
See application file for complete search history.

(56) References Cited

U.S. PATENT DOCUMENTS

| | | | | |
|---|---|---|---|---|
| 2,440,290 A | * | 4/1948 | Pickles ..................... | H01P 3/04 174/34 |
| 2,614,172 A | * | 10/1952 | Greenfield et al. ....... | H01P 3/04 174/29 |
| 6,803,518 B2 | * | 10/2004 | Chang .................. | H01B 11/002 174/113 R |
| 9,136,042 B2 | | 9/2015 | Sugiyama et al. | |

FOREIGN PATENT DOCUMENTS

JP  2014-029799 A  2/2014

* cited by examiner

*Primary Examiner* — Benny Lee
(74) *Attorney, Agent, or Firm* — McGinn IP Law Group, PLLC (57) ABSTRACT

A differential signal cable includes a pair of signal line conductors for transmitting differential signals, an insulation collectively covering the pair of signal line conductors, a shielding tape wrapped around the insulation, and an insulating tape wound around the shielding tape. A gap is formed between an outer peripheral surface of the insulation and an inner surface of the shielding tape such that the insulation is movable relative to the shielding tape.

15 Claims, 10 Drawing Sheets

8 LASER OUTER DIAMETER MEASURING INSTRUMENT

MULTI-CORE DIFFERENTIAL SIGNAL CABLE INCLUDING A GAP FOR A MOVABLE INSULATION

The present application is based on Japanese patent application No. 2014-214390 filed on Oct. 21, 2014, the entire contents of which are incorporated herein by reference.

BACKGROUND OF THE INVENTION

1. Field of the Invention

The invention relates to a differential signal cable formed by winding a shielding tape and thereon an insulating tape around an insulation which covers a pair of signal line conductors, and a multi-core differential signal transmission cable including multiple ones of the differential signal cable.

2. Description of the Related Art

JP-A-2014-29799 discloses a differential signal cable formed by winding a shielding tape and thereon an insulating tape around an insulation which covers a pair of signal line conductors. The differential signal cable is used for transmitting signals in e.g. a high-frequency band of not less than 10 Gbps.

The differential signal cable disclosed in JP-A-2014-29799 is provided with an insulated wire formed by providing an insulation to cover a pair of conductive wires for transmitting signals, a shielding tape (a shield tape conductor) wrapped along the outer peripheral surface of the insulated wire, and first and second insulating tapes spirally wound along the outer peripheral surface of the shielding tape.

The shielding tape is formed by laminating a resin layer formed of a flexible insulating resin and a metal layer formed of a conductive metal such as copper or aluminum and provided on one of surfaces of the resin layer. The first insulating tape is wound around the outer periphery of the shielding tape, and the second insulating tape is wound around the outer periphery of the first insulating tape.

The first and second insulating tapes are spirally wound at a predetermined tension, as shown in FIGS. 5 and 6 of JP-A-2014-29799, by using a manufacturing apparatus provided with a turning mechanism for turning tape reels.

SUMMARY OF THE INVENTION

In order to increase the flexibility of the differential signal cable, it may be devised to thin the shielding tape. However, the thinned shielding tape may decrease in strength such that it is subjected to a damage such as cracks on the shielding tape, e.g., when the differential signal cable is bent to a small radius of curvature.

It is an object of the invention to provide a differential signal cable that prevents the damage on a shielding tape, as well as a multi-core differential signal transmission cable using the differential signal cable.

(1) According to one embodiment of the invention, a differential signal cable comprises:

a pair of signal line conductors for transmitting differential signals;

an insulation collectively covering the pair of signal line conductors;

a shielding tape wrapped around the insulation; and an insulating tape wound around the shielding tape, wherein a gap is formed between an outer peripheral surface of the insulation and an inner surface of the shielding tape such that the insulation is movable relative to the shielding tape.

(2) According to another embodiment of the invention, a multi-core differential signal transmission cable comprises a plurality of ones of the differential signal transmission cable according to the embodiment (1) that are collectively shielded.

According to an embodiment of the invention, a differential signal cable can be provided that prevents the damage on a shielding tape, as well as a multi-core differential signal transmission cable using the differential signal cable.

BRIEF DESCRIPTION OF THE DRAWINGS

Next, the present invention will be explained in more detail in conjunction with appended drawings, wherein:

FIG. 7AB is an illustration diagram schematically showing a cross section of the differential signal transmission cable during the measurement;

DETAILED DESCRIPTION OF THE PREFERRED EMBODIMENTS

Embodiment

Figure 1:
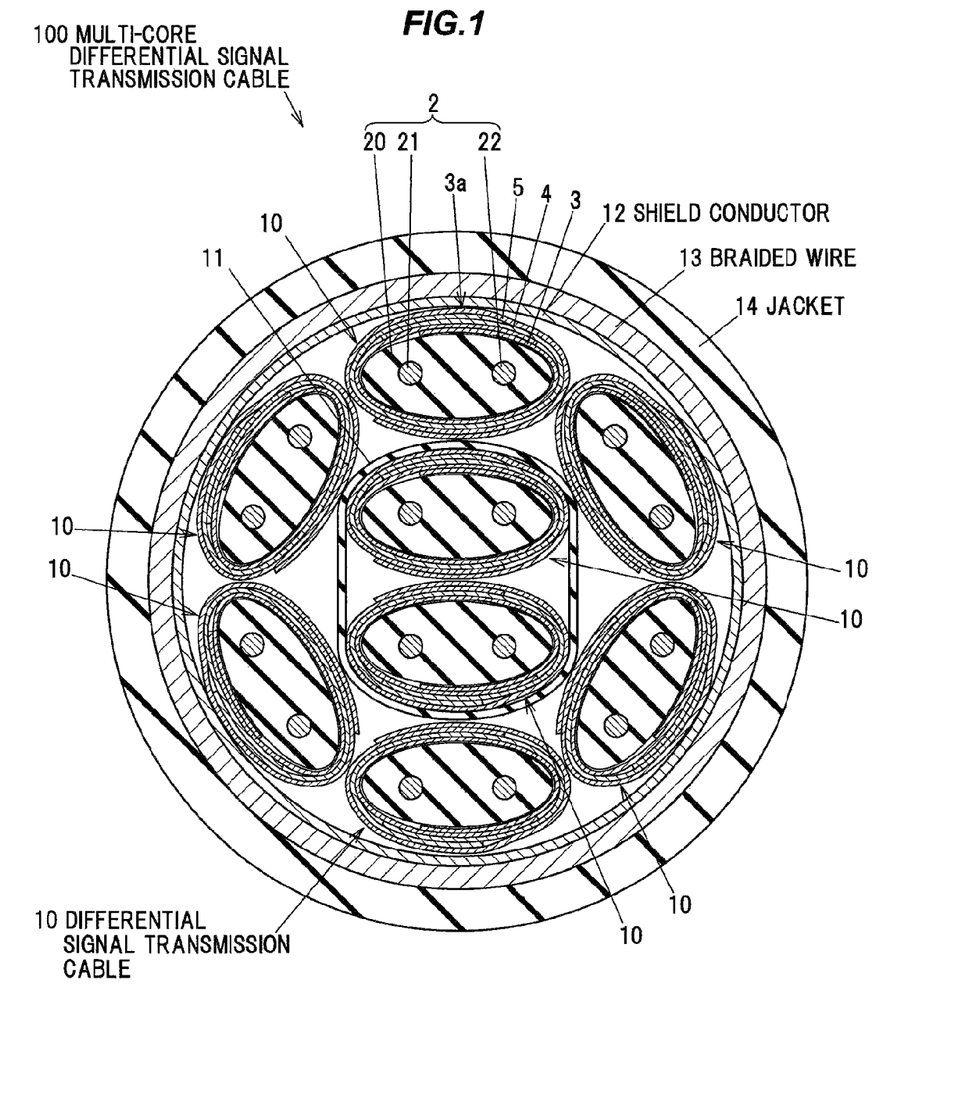
FIG. 1 is a cross sectional view showing a structure of a multi-core differential signal transmission cable having plural differential signal transmission cables in an embodiment of the present invention.

FIG. 1 is a cross sectional view showing a structure of a multi-core differential signal transmission cable having plural differential signal transmission cables in the embodiment of the invention.

A multi-core differential signal transmission cable 100 is configured that plural bundled differential signal transmission cables 10 (eight in the example shown in FIG. 1), a shield conductor 12 shielding the plural bundled differential signal transmission cables 10 all together and a braided wire 13 further provided to cover the outer periphery of the shield conductor 12 are housed in a flexible insulation jacket 14.

In the example shown in FIG. 1, two of the differential signal transmission cables 10 are arranged at the center of the multi-core differential signal transmission cable 100 and are housed in a cylindrical interposed material 11 formed of twisted thread or expanded polyolefin. Then, the remaining six differential signal transmission cables 10 are arranged on the outer side of the interposed material 11 at substantially equal intervals. The cylindrical interposed material 11 is in a tangential contact with each of the differential signal cables 10. Further, the cylindrical interposed material 11 is in the tangential contact with opposing edges of at least one of a pair of the differential signal cables 10.

Configuration of Differential Signal Transmission Cable 10

Figure 2:
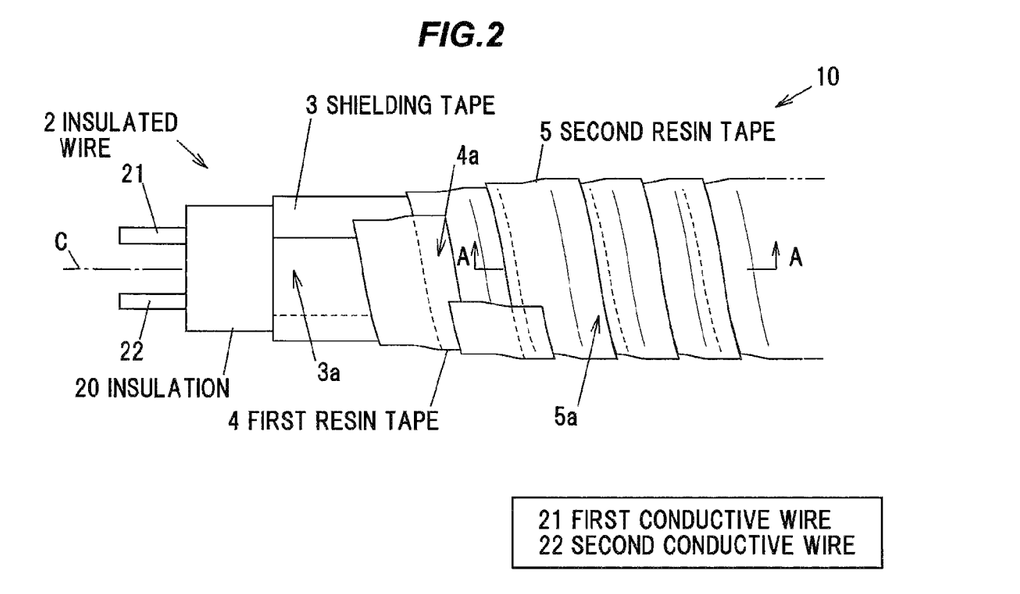
FIG. 2 is a side view showing a configuration of the differential signal transmission cable.

FIG. 2 is a side view showing a configuration of the differential signal transmission cable 10 in the present embodiment.

The differential signal transmission cable 10 is provided with a pair of signal line conductors 21 and 22 for transmitting differential signals, an insulation 20 covering the pair of signal line conductors 21 and 22 (FIGS. 1, 5A, 6A, and 7B) all together, a shielding tape 3 (FIGS. 1, 5A, and 7B) wrapped around the insulation 20, and first and second insulating resin tapes 4 (FIGS. 1 and 7B) and 5 (FIGS. 1 and 7B) wound around the shielding tape 3. The insulation 20 and the pair of signal line conductors 21 and 22 constitute a parallel double-core insulated wire 2 (FIGS. 1, 6A, and 7B). The pair of signal line conductors 21 and 22 are arranged in parallel to a central axis C of the insulated wire 2 at a certain distance. Hereinafter, one of the pair of the signal line conductors 21 and 22 is referred to as the first signal line conductor 21 and the other is referred to as the second signal line conductor 22.

As shown in FIG. 1, a cross-section of the insulation 20, which is taken orthogonal to its extending direction along the central axis C, has an ellipse shape having a major axis in an alignment direction of the first and second signal line conductors 21 and 22 and a minor axis on a perpendicular bisector of the major axis. In other words, the insulation 20 has an outer peripheral shape entirely formed of a smooth continuous convex curved surface without flat portions or dents. The major axis of the insulation 20 is, e.g., 2.0 mm and the minor axis is, e.g., 1.0 mm. As a material of the insulation 20, it is possible to preferably use, e.g., a non-foamed insulating resin. One specific example of such a resin material is non-expanded polyethylene.

The shielding tape 3 is formed of a band-shaped member having a conductive metal layer and is wrapped or lapped longitudinally parallel to the extending direction of the insulation 20 so that the edges in a tape width direction overlap. That is, the shielding tape 3 has a tape width greater than the circumferential length of the insulation 20 on the cross section mentioned above and is wrapped around the insulation 20 so that the tape length direction is parallel to the central axis C of the insulated wire 2. An overlapping portion 3a (FIGS. 1, 3, 5A, and 6A) of the shielding tape 3, at which the edges in the tape width direction overlap, extends in parallel to the central axis C of the insulated wire 2.

The first insulating tape 4 is constructed from a band-shaped tape member formed of a flexible insulating resin and is spirally wound so that one widthwise end portion overlaps the other widthwise end portion at an overlapping portion 4a. The second insulating tape 5 is constructed from a band-shaped tape member formed of a flexible insulating resin and is spirally wound so that one widthwise end portion overlaps the other widthwise end portion at an overlapping portion 5a, in the same manner as the first insulating tape 4. For the purpose of explanation, FIG. 2 shows a state in which the first insulating tape 4 and the second insulating tape 5 are partially removed.

The shielding tape 3 and the first and second insulating tapes 4 and 5 are wrapped/wound in the same circumferential direction about the central axis C of the insulated wire 2. That is, the first insulating tape 4 is wound from an edge of the shielding tape 3 located on the lower side (inside) at the overlapping portion 3a and indicated by a broken line in FIG. 2 toward another edge located on the upper side (outside) and indicated by a solid line. The second insulating tape 5 is wound in the same direction.

Figure 3:
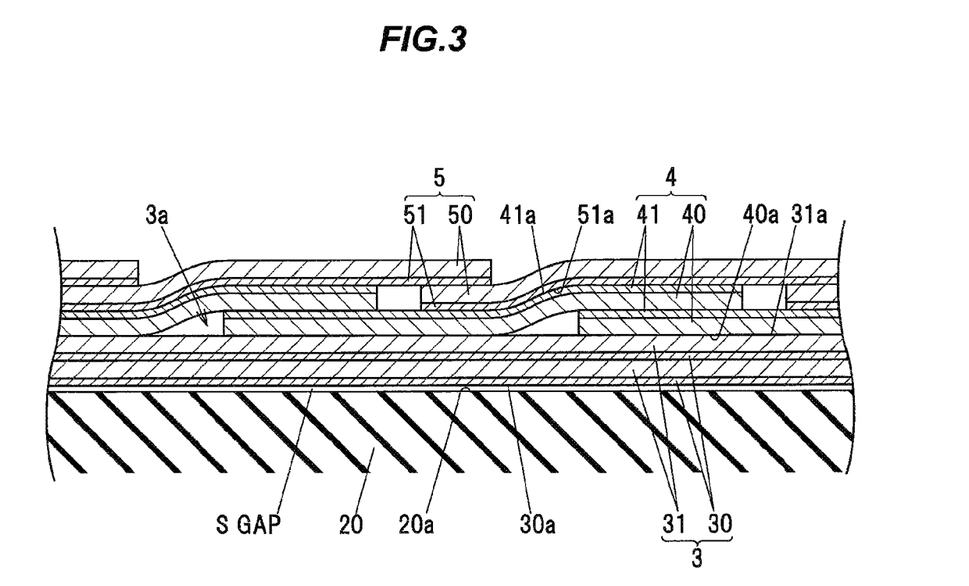
FIG. 3 is a partial cross sectional view showing the differential signal transmission cable taken on line A-A of FIG. 2.

FIG. 3 is a partial enlarged cross sectional view showing the differential signal transmission cable 10 taken on line A-A of FIG. 2. In this drawing, the thicknesses of the shielding tape 3, the first insulating tape 4 and the second insulating tape 5 are exaggerated for the purpose of explanation.

The shielding tape 3 is formed by laminating, e.g., a resin layer 30 formed of a flexible insulating resin such as polyester and a metal layer 31 formed of a highly conductive metal such as copper or aluminum and provided on one of surfaces of the resin layer 30. The resin layer 30 is arranged on the insulated wire side with respect to the metal layer 3l, and a surface 30a (FIG. 6A) of the resin layer 30 faces an outer peripheral surface 20a of the insulation 20. The thickness of the metal layer 31 is, e.g., 6 to 12 μm.

The first insulating tape 4 has, e.g., a resin layer 40 formed of a flexible insulating resin such as polyester and an adhesive layer 41 containing an adhesive agent and laminated on the resin layer 40. The adhesive layer 41 is arranged on the outer side of the differential signal transmission cable 10 (see FIG. 2) with respect to the resin layer 40. A surface 40a of the resin layer 40 is arranged contacting a surface 31a of the metal layer 31 of the shielding tape 3.

The second insulating tape 5 has e.g., a resin layer 50 formed of a flexible insulating resin such as polyester and an adhesive layer 51 containing an adhesive agent and laminated on the resin layer 50, in the same manner as the first insulating tape 4. The adhesive layer 51 is arranged on the inner side of the differential signal transmission cable 10 with respect to the resin layer 50. A surface 51a of the adhesive layer 51 is partially in contact with and bonded to a surface 41a of the adhesive layer 41 of the first insulating tape 4. In other words, the first insulating tape 4 and the second insulating tape 5 are bonded to each other by the adhesive layers 41 and 51 which are respectively provided on the outer periphery side of the first insulating tape 4 and on the inner periphery side of the second insulating tape 5.

In the present embodiment, the first insulating tape 4 and the second insulating tape 5 have the same width and thickness. In other words, the first insulating tape 4 and the second insulating tape 5 are composed of the same elements and dimensions, except that the positions of the adhesive layers 41 and 51 with respect to the resin layers 40 and 50 are opposite. The thickness of the resin layers 40 and 50 is, e.g., 10 to 15 μm, respectively and the thickness of the adhesive layers 41 and 51 is, e.g., 2 to 5 μm, respectively.

The differential signal transmission cable 10 having such a configuration transmits differential signals in, e.g., a high-frequency band of not less than 10 Gbps through the first and second signal line conductors 21 and 22. That is, in a communication method using the differential signal transmission cable 10, opposite phase signals are output from a transmitter to the first and second signal line conductors 21 and 22, and the transmitted signals are received (combined) by a receiver based on a potential difference between the first and second signal line conductors 21 and 22. In this communication method, if noise is superimposed on, e.g., the first signal line conductor 21, similar noise is also superimposed on the second signal line conductor 22, resulting in reducing an impact on a potential difference between the signals on the receiving side and thus allowing for communication with high noise immunity.

Next, a method and apparatus for manufacturing the differential signal transmission cable 10 will be described in reference to FIGS. 4, 5A and 5B.

Figure 4:
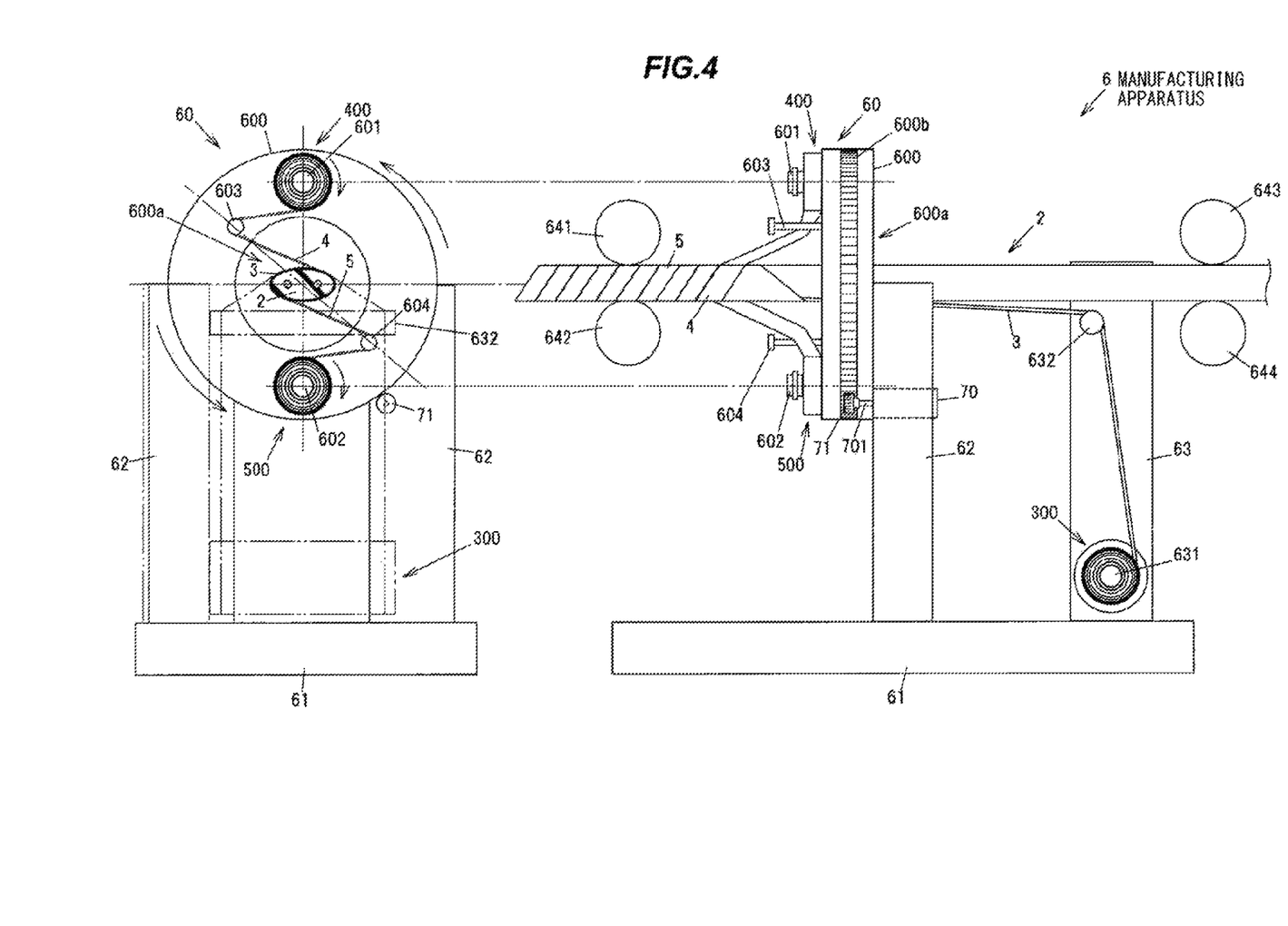
FIG. 4 is an illustration diagram schematically showing an example of a manufacturing apparatus for manufacturing the differential signal transmission cable.

FIG. 4 is an illustration diagram schematically showing an example of a manufacturing apparatus 6 for manufacturing the differential signal transmission cable 10 (see FIG. 2). FIG. 5A is an enlarged perspective view showing a main section in FIG. 4 and FIG. 5B is an illustration diagram showing a specific example of a tension control mechanism for controlling tension for winding the first insulating tape 4 around the shielding tape 3.

As shown in FIG. 4 the manufacturing apparatus 6 has a base 61 on which a pair of supporting posts 62 and a reel support pole 63 are provided upright. A turning mechanism 60, which is a spiral winding means for spirally winding the first insulating tape 4 and the second insulating tape 5 in the same direction, is supported on the pair of supporting posts 62.

The turning mechanism 60 has an annular member 600 having an annular shape and rotatably supported on the pair of supporting posts 62 by a bearing (not shown), first and second supporting members 601 (FIG. 5A) and 602 (FIG. 5A) fixed to one of a pair of flat surfaces of the annular member 600, a first guide member 603 (FIG. 5A) for guiding the first insulating tape 4, and a second guide member 604 (FIG. 5A) for guiding the second insulating tape 5.

A reel 400 with the first insulating tape 4 wound thereon is rotatably supported by the first supporting member 601, and a reel 500 with the second insulating tape 5 wound thereon is rotatably supported by the second supporting member 602. The first insulating tape 4 is drawn from the reel 400 and is guided to the outer periphery side of the shielding tape 3 through the first guide member 603. The second insulating tape 5 is drawn from the reel 500 and is guided to the outer periphery side of the first insulating tape 4 through the second guide member 604.

Figure 5A:
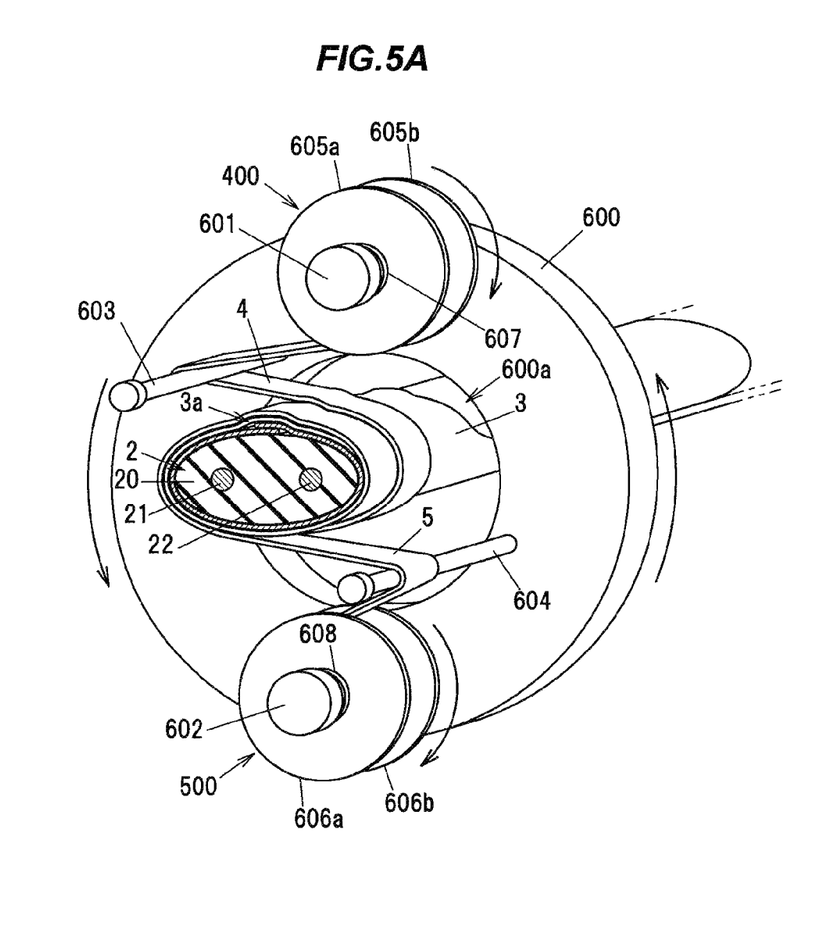
FIG. 5A is an enlarged perspective view showing a main section in FIG. 4.
Figure 6A:
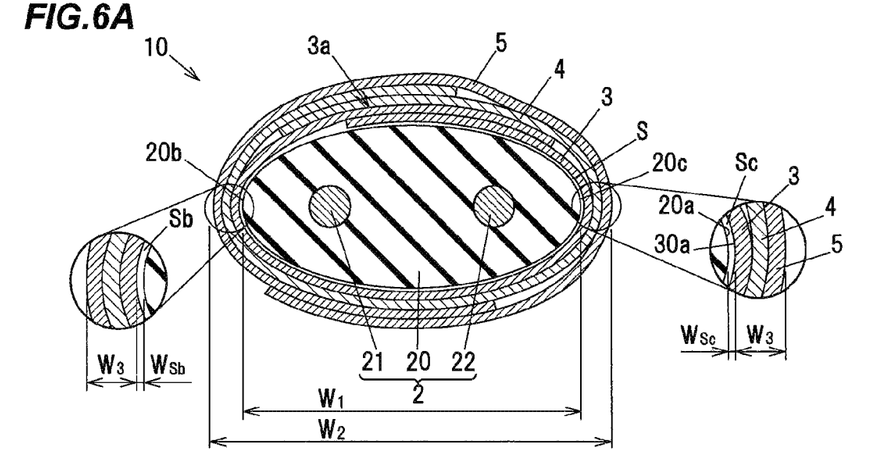
FIG. 6A is a cross sectional view showing the differential signal transmission cable in the embodiment.

As shown in FIG. 5A, the reel 400 with the first insulating tape 4 wound thereon is sandwiched between a pair of retainer plates 605a and 605b, and the reel 500 with the second insulating tape 5 wound thereon is sandwiched between a pair of retainer plates 606a and 606b. In FIG. 4, the retainer plates 605a, 605b, 606a and 606b are not shown.

A through-hole 600a for passing the insulated wire 2 is formed at the center of the annular member 600. A motor 70 (FIG. 4), which generates a driving force to rotate the annular member 600, is supported on one of the pair of supporting posts 62. A pinion gear 71 is relatively non-rotatably fixed to a rotating shaft 701 of the motor 70, as shown in FIG. 4. The pinion gear 71 meshes with gear teeth 600b (FIG. 4) formed on the outer peripheral surface of the annular member 600 so that the annular member 600 rotates with the rotation of the rotating shaft 701 of the motor 70.

As shown in FIG. 4, the manufacturing apparatus 6 also has first to fourth wheels 641, 642, 643, and 644 as a moving means for applying tension to the insulated wire 2 at the same time moving the insulated wire 2 along a longitudinal direction thereof. The first and second wheels 641 and 642 are arranged to face the flat surface of the annular member 600 with the first and second supporting members 601 and 602 provided thereon, and sandwich and hold the insulated wire 2 on which the shielding tape 3 and the first and second insulating tapes 4 and 5 are wound. The third and fourth wheels 643 and 644 are arranged to face a flat surface of the annular member 600 opposite to the flat surface with the first and second supporting members 601 and 602 provided thereon, and sandwich and hold the insulated wire 2.

The first and second wheels 641 to 642 are rotationally driven by a drive mechanism (not shown), and move and draw the insulated wire 2 through the through-hole 600a. The third and fourth wheels 643 and 644 receive a rotation-resisting force from, e.g., a braking mechanism (not shown) and are supported so as to be able to rotate while receiving the rotation-resisting force. The insulated wire 2, which is pulled by the first and second wheels 641 to 642 while receiving a braking force based on the rotation-resisting force applied to the third and fourth wheels 643 and 644, moves along the longitudinal direction in a state that tension is applied in the central axis direction.

A supporting portion 631 is fixed to the reel support pole 63 and rotatably supports a reel 300 with the shielding tape 3 wound thereon. In addition, a third guide member 632 is fixed to the reel support pole 63 above the supporting portion 631 and guides the shielding tape 3 drawn from the reel 300 to the outer periphery side of the insulated wire 2.

The shielding tape 3 is guided by the third guide member 632, is then, as shown in FIG. 4, sandwiched between the outer peripheral surface 20a of the insulation 20 of the insulated wire 2 and the first insulating tape 4, as shown in FIG. 6A (the surface 40a of the resin layer 40, as shown in FIG. 3), and is thereby longitudinally wrapped along the outer peripheral surface of the insulated wire 2.

In the present embodiment, a gap S is formed between the outer peripheral surface 20a of the insulation 20 and an inner surface of the shielding tape 3 (the surface 30a of the resin layer 30) as shown in FIG. 3 so that the insulation 20 is relatively movable with respect to the shielding tape 3. "Relatively movable" here means that, in a state that the differential signal transmission cable 10 (see FIG. 2) is arranged linearly, the shielding tape 3 is not pressed against the insulation 20 by the tension of the first and second insulating tapes 4 and 5, a frictional force resulting from the tension of the first and second insulating tapes 4 and 5 (a tight-binding force applied to the shielding tape 3) is not generated between the insulation 20 of the insulated wire 2 and the shielding tape 3, and the insulated wire 2 can thus freely move along its extending direction with respect to the shielding tape 3.

It is possible to increase or decrease the size of the gap S during the manufacture of the differential signal transmission cable 10 by adjusting tension for winding the first and second insulating tapes 4 and 5 around the shielding tape 3. In more detail, the size of the gap S is increased or decreased by controlling the rotation-resisting force which is applied to the reels 400 and 500 from the tension control mechanism described below.

Figure 5B:
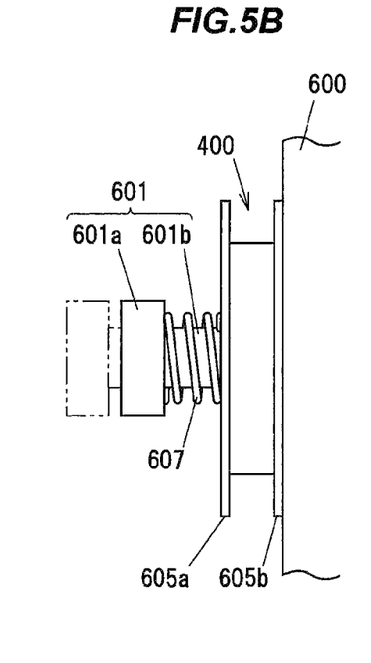
FIG. 5B is an illustration diagram showing a specific example of a tension control mechanism for controlling tension for winding a first insulating tape around a shielding tape.

As shown in FIG. 5B, a tension control mechanism for applying a rotation-resisting force to the reel 400 is composed of the first supporting member 601 and a coil spring 607. The first supporting member 601 has a bolt-like shape composed of a disc-shaped head 601a and a rod-shaped shank 601b having a smaller diameter than the head 601a. An external thread is formed at an end of the shank 601b opposite to the head 601a and is threadably engaged with an internal thread (illustration omitted) formed on the annular member 600.

The coil spring 607 (FIG. 5A) is arranged in an axially compressed state between the retainer plate 605a, which is one of the pair of retainer plates 605a and 605b and is located opposite to the annular member 600, and the head 601a of the first supporting member 601. Then, the retainer plate 605b located on the annular member 600 side is pressed against the annular member 600 by a spring force (restoring force) of the coil spring 607.

The reel 400 is sandwiched between the retainer plates 605a and 605b by the spring force of the coil spring 607, and thus receives a rotation-resisting force when rotating about the central axis of the first supporting member 601. The rotation-resisting force varies depending on the axial position of the head 601a of the first supporting member 601 with respect to the annular member 600. That is, by changing the screw-in depth of the shank 601b of the first supporting member 601 into the annular member 600, it is possible to change the spring force generated by the coil spring 607 and thereby to control the rotation-resisting force applied to the reel 400 at the time of rotation.

In other words, when the screw-in depth of the shank 601b of the first supporting member 601 is increased, the coil spring 607 is more compressed, the spring force thus increases and the rotation-resisting force becomes stronger. This increases tension for winding the first insulating tape 4 around the shielding tape 3. When the screw-in depth of the shank 601b of the first supporting member 601 is decreased in the opposite manner, tension for winding around the shielding tape 3 is reduced.

Likewise, a tension control mechanism for applying a rotation-resisting force to the reel 500 is composed of the second supporting member 602 and a coil spring 608 (FIG. 5A). The structure and function thereof are the same as those described in reference to FIG. 5B and the detail description of the tension control mechanism for the reel 500 is omitted.

The tension of the first and second insulating tapes 4 and 5 when winding around the shielding tape 3 can be detected by measuring tension of the first and second insulating tapes 4 and 5 between the first and second guide members 603/604 and the shielding tape 3 using, e.g., a tension meter.

Figure 6B:
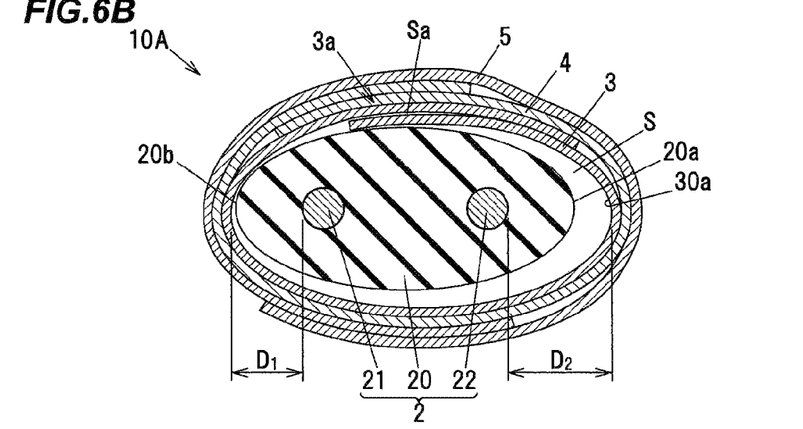
FIG. 6B is a cross sectional view showing a differential signal transmission cable with first and second insulating tapes wound at relatively low tension.
Figure 6C:
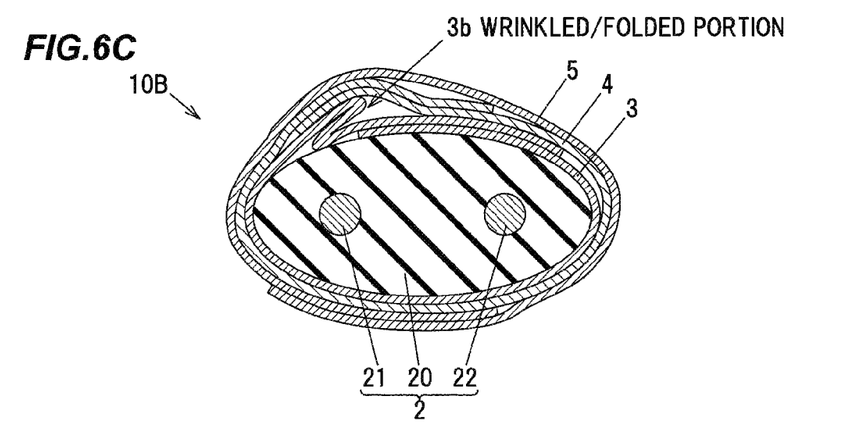
FIG. 6C is a cross sectional view showing a differential signal transmission cable with first and second insulating tapes wound at relatively high tension.

FIG. 6A is a cross sectional view showing the differential signal transmission cable 10 in the present embodiment. FIG. 6B is a cross sectional view showing a differential signal transmission cable 10A with the first and second insulating tapes 4 and 5 wound at lower tension than that for the differential signal transmission cable 10 of the present embodiment. FIG. 6C is a cross sectional view showing a differential signal transmission cable 10B with the first and second insulating tapes 4 and 5 wound at higher tension than that for the differential signal transmission cable 10 of the present embodiment. The differential signal transmission cables 10A and 10B, of FIGS. 6B to 6C, respectively, are provided with the insulated wire 2, the shielding tape 3 and the first and second insulating tapes 4 and 5 in the same manner as the differential signal transmission cable 10 of the present embodiment but the tension of the first and second insulating tapes 4 and 5 is different.

As shown in FIG. 6B, in the differential signal transmission cable 10A of which first and second insulating tapes 4 and 5 are wound at low tension, a large gap S is formed between the surface 30a of the resin layer (i.e., the inner surface of the shielding tape 3) and the outer peripheral surface 20a of the insulation 20. In case that such a large gap S is formed, a difference between a distance D1 from the first signal line conductor 21 to the shielding tape 3 and a distance D2 from the second signal line conductor 22 to the shielding tape 3 increases when the position of the insulated wire 2 moves to one side in a space inside the shielding tape 3. In addition, a gap Sa is likely to be formed between the overlapped shield tapes at the overlapping portion 3a of the shielding tape 3. This may cause a difference in signal propagation characteristics between the first signal line conductor 21 and the second signal line conductor 22 and skew may thereby occur between the differential signals propagating through the insulated wire 2, resulting in that the receiver may not be able to receive the signals correctly.

On the other hand, in the differential signal transmission cable 10B of which first and second insulating tapes 4 and 5 are wound at high tension, the shielding tape 3 is folded at a circumferential position by a tightening force received from the first and second insulating tapes 4 and 5 and a wrinkled/folded portion 3b is formed unintentionally, as shown in FIG. 6C. The wrinkled/folded portion 3b may cause cracks on the shielding tape 3 and skew may occur between the differential signals propagating through the insulated wire 2 due to a difference in signal propagation characteristics between the first signal line conductor 21 and the second signal line conductor 22, resulting in that the receiver may not be able to receive the signals correctly, in the same manner as the differential signal transmission cable 10A in FIG. 6B.

In the differential signal transmission cable 10 in the present embodiment, as shown in FIG. 6A, a first gap Sb and a second gap Sc are formed between an end portion 20b/another end portion 20c of the insulation 20 in a major axis direction and the shielding tape 3. The sum of a width $W_{Sb}$ of the first gap Sb and a width $W_{Sc}$ of the second gap Sc is 10 to 20 μm (not less than 10 μm and not more than 20 μm). In other words, the sum of the widths $W_{Sb}$ and $W_{Sc}$ of the first and second gap Sb and Sc formed between the both end portions 20b (FIG. 6B) and the 20c, along the major axis, of the insulation 20 and the shielding tape 3 is 10 to 20 μm. Hereinafter, this sum is defined as a gap width of gap S.

The gap width WS can be expressed by the following formula, where W1 is the major axis dimension of the insulation 20, W2 is the overall width of the differential signal transmission cable 10 in the direction of the major axis of the insulation 20, and W3 is the total thickness of the shielding tape 3 and the first and second insulating tapes 4 and 5, as shown in FIG. 6A.

$$W_S = W_2 - W_1 - W_3 \times 2 \tag{1}$$

The overall width $W_2$ of the differential signal transmission cable 10 can be measured by optical measurement using, e.g., a laser outer diameter measuring instrument. Next, the measurement method will be described.

Figure 7A:
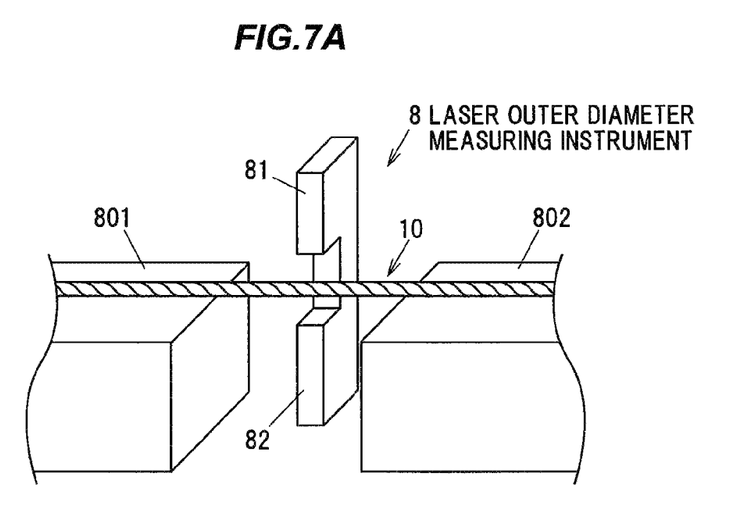
FIG. 7A is an illustration diagram showing a specific example of a method to measure the overall width of the differential signal transmission cable in a major axis direction using a laser outer diameter measuring instrument.
Figure 7B:
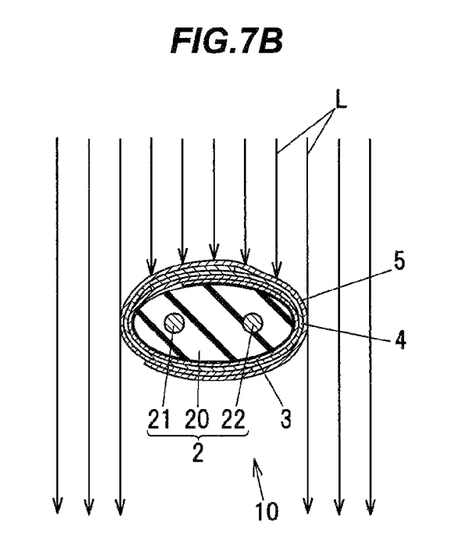

FIG. 7A is an illustration diagram showing a specific example of a method to measure the overall width W2 (FIG. 6A) of the differential signal transmission cable 10 using a laser outer diameter measuring instrument 8. FIG. 7B is an illustration diagram schematically showing a cross section of the differential signal transmission cable 10 during the measurement.

As shown in FIG. 7A, in the laser outer diameter measuring instrument 8, a laser beam L (FIG. 7B), which is emitted from a light-emitting portion 81 and is received by a light receiving portion 82, is partially blocked by the differential signal transmission cable 10 as an object to be measured, and a width of the differential signal transmission cable 10 in the direction of the major axis of the insulation 20 (FIG. 7B) is thereby measured.

The differential signal transmission cable 10 is stretched at a predetermined tension, for example tensile force of 9N, and is placed to bridge between first and second supporting bases 801 and 802 so that the direction of the major axis of the insulation 20 is orthogonal to the laser beam L. Then, the width is measured at several points (e.g., ten points or more) while moving the differential signal transmission cable 10 at, e.g., 50 mm intervals in the extending direction thereof, and the average is defined as the overall width W2 of the differential signal transmission cable 10.

As shown, for example, in FIG. 6A, the major axis dimension $W_1$ of the insulation 20 and the total thickness $W_3$ of the shielding tape 3 and the first and second insulating tapes 4 and 5 can be preliminarily obtained, it is possible to calculate the sum $W_S$ of the widths $W_{Sb}$ and $W_{Sc}$ of the first and second gaps Sb and Sc by the above-mentioned formula (1) based on the measurement result of the overall width $W_2$ of the differential signal transmission cable 10. Since the total thickness $W_3$ of the shielding tape 3 and the first and second insulating tapes 4 and 5 is different depending on positions on the differential signal transmission cable 10 in the extending direction due to overlap of the spirally wound first and second insulating tapes 4 and 5, it is desirable to use the average value.

Figure 8:
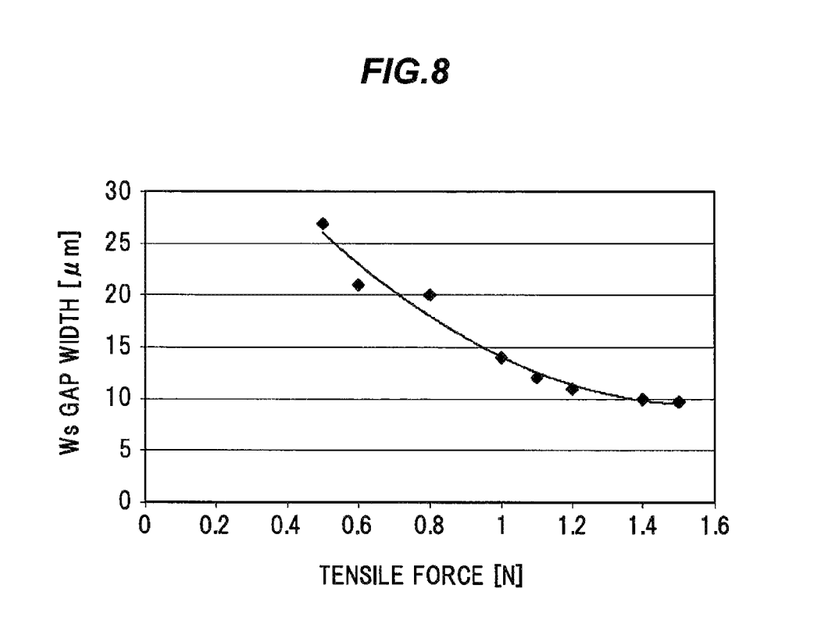
FIG. 8 is a graph showing a relation between tension for winding the first and second insulating tapes during the manufacture of the differential signal transmission cable and a gap width.

FIG. 8 is a graph showing a relation between tension (i.e., tensile force in N) for winding the first and second insulating tapes 4 and 5 during the manufacture of the differential signal transmission cable 10 and the gap width $W_S$ (in μm).

As shown in FIG. 8, the gap width WS decreases with increasing the tension of the first and second insulating tapes 4 and 5. In other words, it is possible to increase or decrease the gap width WS by controlling the tension for winding the first and second insulating tapes 4 and 5 during the manufacture of the differential signal transmission cable 10.

Figure 9:
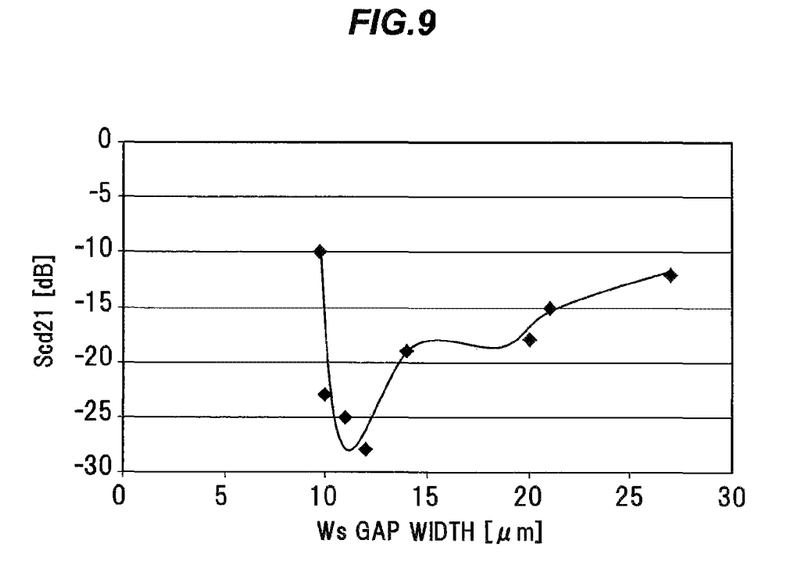
FIG. 9 is a graph showing a relation between the gap width from both end portions of an insulation in the major axis direction to the shield tape and an S-parameter Scd21.

FIG. 9 is a graph showing a relation between the gap width WS (in μm) and an S-parameter Scd21 in dB (differential to common mode conversion characteristics) representing signal transmission characteristics of the differential signal transmission cable 10. As shown in the graph, when the gap width WS is in the range of 10 to 20 μm, Scd 21 values of below −15 dB are obtained which proves the good characteristics of the cable.

Figure 10:
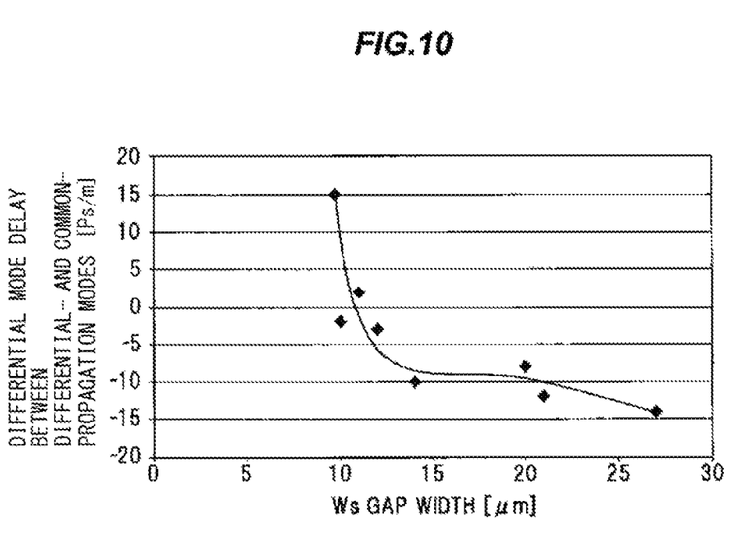
FIG. 10 is a graph showing a relation between the gap width and the differential mode delay between differential- and common-propagation modes in the differential signal transmission cable.

FIG. 10 is a graph showing a relation between the gap width $W_S$ (in μm) and the differential mode delay between differential- and common-propagation modes in Ps/m for the differential signal transmission cable 10. As shown in the graph, when the gap width $W_S$ is in the range of 10 to 20 μm, a differential mode delay between differential- and common-propagation modes (absolute value) of not more than 10 ps/m is obtained which proves the good characteristics of the cable.

Functions and Effects of the Embodiment

The following functions and effects are obtained in the embodiment.

(1) In the differential signal transmission cable 10, since the gap S is formed between the outer peripheral surface 20a of the insulation 20 and the inner surface of the shielding tape 3 (the surface 30a of the resin layer 30) to allow the insulation 20 to relatively move with respect to the shielding tape 3, formation of the wrinkled/folded portion 3b and resulting cracks on the shielding tape 3 can be prevented. In addition, it is possible to prevent the shielding tape 3 from being damaged such as breaking when, e.g., the differential signal transmission cable 10 is bent. Normally, when the differential signal transmission cable 10 is bent, the outer peripheral surface 20a of the insulation 20 is stretched in the direction of the central axis C on the outer side of the bent portion and is contracted on the inner side. However, in the present embodiment, since the shielding tape 3 is not pressed against the insulation 20 by the tension of the first and second insulating tapes 4 and 5 and the outer peripheral surface 20a of the insulation 20 easily slides against the shielding tape 3 due to the gap S formed therebetween, it is possible to prevent the shielding tape 3 from, e.g., being stretched and torn or being largely lifted from the outer peripheral surface 20a of the insulation 20 due to wrinkle formation.

(2) Since the shielding tape 3 is longitudinally wrapped around the insulation 20 of the insulated wire 2, the shielding tape 3 does not move in the direction of the central axis C of the insulated wire 2 even if not being tightened by the first and second insulating tapes 4 and 5. That is, if the shielding tape 3 is spirally wound around the insulation 20 and the gap S is formed, the shielding tape 3 moves in the direction of the central axis C of the insulated wire 2 and a portion of the outer peripheral surface 20a of the insulation 20 may not be covered with the shielding tape 3. However, in the present embodiment, since the shielding tape 3 is longitudinally wrapped around the insulation 20 of the insulated wire 2, such an uncovered portion is not formed.

(3) The cross-section of the insulation 20 taken orthogonal to the extending direction thereof has an ellipse shape having a major axis in an alignment direction of the first and second signal line conductors 21 and 22 and the gap S is formed between the both end portions 20b and the 20c in the major axis direction and the shielding tape 3. That is, since the gap S is formed between the both end portions 20b and the 20c in the major axis direction, at which the gap is most likely to be narrowed among circumferential positions on the insulation 20, and the shielding tape 3, damage on the shielding tape 3 can be prevented when the differential signal transmission cable 10 is bent, regardless of the bend direction.

(4) Since the gap width WS of the gap S formed between the two end portions 20b and the 20c, along the major axis, of the insulation 20 and the shielding tape 3 is 10 to 20 μm, it is possible to obtain good signal transmission characteristics as shown in FIGS. 9 and 10.

SUMMARY OF THE EMBODIMENTS

Technical ideas taken from the above embodiments will be represented below with the reference numerals etc. used in the embodiments. However, each reference numeral described below is not intended to limit the constituent elements in the claims to the members etc. specifically described in the embodiments.

[1] A differential signal cable (10), comprising: a pair of signal line conductors (21, 22) for transmitting differential signals; an insulation (20) covering the pair of signal line conductors (21, 22) all together; a shielding tape (3) wrapped around the insulation (20); and an insulating tape (the first and second insulating tapes 4 and 5) wound around the shielding tape (3), wherein a gap (S) is formed between the outer peripheral surface (20a) of the insulation (20) and the inner surface of the shielding tape (3) so that the insulation (20) is relatively movable with respect to the shielding tape (3).

[2] The differential signal cable (10) described in [1], wherein the shielding tape (3) is wrapped longitudinally parallel to an extending direction of the insulation (20).

[3] The differential signal cable (10) described in [1] or [2], wherein a cross-section of the insulation (20) taken orthogonal to the extending direction thereof has an ellipse shape having a major axis in an alignment direction of the pair of signal line conductors (21, 22), and the gaps (S) are formed between end portions (20b, 20c), along the major axis, of the insulation (20) and the shield tape (3).

[4] The differential signal cable described in [3], wherein the sum (gap width $W_S$) of widths of the gaps (S) formed between the both end portions (20b, 20c), along the major axis, of the insulation (20) and the shield tape (3) is 10 to 20 μm.

[5] A multi-core differential signal transmission cable (100), comprising: a plurality of the differential signal transmission cables (10) described in any one of [1] to [4] that are shielded all together.

Although the embodiment of the invention has been described, the invention according to claims is not to be limited to the embodiment. Further, all combinations of the features described in the embodiment are not necessary to solve the problem of the invention.

The invention can be appropriately modified and implemented without departing from the gist thereof. For example, although two layers of insulating tapes (the first insulating tape 4 and the second insulating tape 5) are wound around the shielding tape 3 in the embodiment, it is not limited thereto. The insulating tape may be a single layer. In addition, the winding directions of the two insulating tapes are not limited to the same and the insulating tapes may be spirally wound in opposite directions. Furthermore, one of the two insulating tapes, which is located inside, may be wrapped longitudinally.

What is claimed is:

1. A differential signal cable, comprising:
    a pair of signal line conductors for transmitting differential signals;
    an insulation collectively covering the pair of signal line conductors;
    a shielding tape wrapped around the insulation; and
    an insulating tape wound around the shielding tape,
    wherein a gap is formed between an outer peripheral surface of the insulation and an inner surface of the shielding tape such that the insulation is movable relative to the shielding tape,
    wherein the insulation comprises, in a cross-section thereof orthogonal to an extending direction of the differential signal cable, an ellipse shape that has a major axis in an alignment direction of the pair of signal line conductors,
    wherein the gap is formed, along the major axis, between each of end portions of the insulation and the shielding tape, and
    wherein, along the major axis, a sum of a width of the gap formed between the end portions of the insulation and the shielding tape is from 10 μm to 20 μm.

2. The differential signal cable according to claim 1, wherein the shielding tape is wrapped longitudinally parallel to an extending direction of the insulation.

3. The differential signal cable according to claim 1, wherein the pair of signal line conductors and the insulation constitute an insulated wire and the insulated wire freely moves along an extending direction of the insulated wire with respect to the shielding tape.

4. The differential signal cable according to claim 1, wherein a differential mode delay between differential- and common-propagation modes is not more than 10 ps/m.

5. A multi-core differential signal transmission cable, comprising a plurality of ones of the differential signal cable according to claim 1,
    wherein a shield conductor collectively shields the plurality of ones of the differential signal cable.

6. The multi-core differential signal transmission cable according to claim 5, further comprising:
    a cylindrical interposed material confining a pair of the plurality of ones of the differential signal cable at a center of the multi-core differential signal transmission cable.

7. The multi-core differential signal transmission cable according to claim 6, wherein the cylindrical interposed material is in the tangential contact with opposing edges of at least one of the pair of the plurality of ones of the differential signal cable.

8. The multi-core differential signal transmission cable according to claim 6, wherein the cylindrical interposed material is in a tangential contact with each of the pair of the plurality of ones of the differential signal cable.

9. The multi-core differential signal transmission cable according to claim 8, wherein the cylindrical interposed material is in the tangential contact with opposing edges of each of the pair of the plurality of ones of the differential signal cable.

10. The multi-core differential signal transmission cable according to claim 8, wherein the cylindrical interposed material is in the tangential contact with opposing edges of at least one of the pair of the plurality of ones of the differential signal cable.

11. A multi-core differential signal transmission cable, comprising:
    a plurality of differential signal cables, each of the differential signal cables comprising:
        a pair of signal line conductors for transmitting differential signals;
        an insulation collectively covering the pair of signal line conductors;
        a shielding tape wrapped around the insulation; and
        an insulating tape wound around the shielding tape,
        wherein a gap is formed between an outer peripheral surface of the insulation and an inner surface of the shielding tape such that the insulation is movable relative to the shielding tape; and
    a cylindrical interposed material confining a pair of the plurality of the differential signal cables at a center of multi-core differential signal transmission cable,
    wherein the cylindrical interposed material is in a contact with opposing edges of at least one of the pair of the plurality of the differential signal cables,
    wherein the cylindrical interposed material abuts all of the plurality of the differential signal cables.

12. A multi-core differential signal transmission cable, comprising:
    a plurality of differential signal cables, each of the differential signal cables comprising:
        a pair of signal line conductors for transmitting differential signals;
        an insulation collectively covering the pair of signal line conductors;
        a shielding tape wrapped around the insulation; and
        an insulating tape wound around the shielding tape,
        wherein a gap is formed between an outer peripheral surface of the insulation and an inner surface of the shielding tape such that the insulation is movable relative to the shielding tape; and a cylindrical interposed material confining a pair of the plurality of the differential signal cables at a center of the multi-core differential signal transmission cable, wherein the cylindrical interposed material is in a contact with all of the plurality of the differential signal cables.

13. The multi-core differential signal transmission cable according to claim 12, wherein a differential mode delay between differential- and common-propagation modes is not more than 10 ps/m.

14. The multi-core differential signal transmission cable according to claim 12, wherein the cylindrical interposed material is in a tangential contact with opposing edges of each of the pair of the plurality of the differential signal cables.

15. The multi-core differential signal transmission cable according to claim 12, wherein each of the pair of signal line conductors and the insulation constitute a respective insulated wire and the respective insulated wire freely moves along an extending direction of the respective insulated wire with respect to a corresponding shielding tape.

* * * * *